United States Patent [19]
Duffy et al.
[11] 3,760,242
[45] Sept. 18, 1973

[54] COATED SEMICONDUCTOR STRUCTURES AND METHODS OF FORMING PROTECTIVE COVERINGS ON SUCH STRUCTURES

[75] Inventors: Michael C. Duffy, Wappingers Falls; Jacob Riseman; Bevan P. F. Wu, both of Poughkeepsie, all of N.Y.

[73] Assignee: International Business Machines Corporation, Armonk, N.Y.

[22] Filed: Mar. 6, 1972

[21] Appl. No.: 232,235

Related U.S. Application Data

[63] Continuation of Ser. No. 778,527, Nov. 25, 1968, abandoned.

[52] U.S. Cl.317/235 R, 317/235 AZ, 317/235 AG, 317/234 F, 317/235 F, 117/212
[51] Int. Cl. .............................. H01l 3/10, H01l 3/00
[58] Field of Search ............... 317/235 AZ, 235 AG, 317/234 F, 235 F

[56] References Cited

UNITED STATES PATENTS

| | | | |
|---|---|---|---|
| 3,597,667 | 8/1971 | Horn | 317/235 |
| 3,477,886 | 11/1969 | Bergh | 148/187 |
| 3,438,873 | 4/1969 | Schmidt | 204/35 |
| 3,438,121 | 4/1969 | Waslass | 29/578 |
| 3,373,051 | 3/1968 | Chu et al. | 117/106 |
| 3,460,003 | 9/1969 | Hampikian | 317/234 |
| 3,457,475 | 7/1969 | Cheng chen | 317/234 |
| 3,465,209 | 9/1969 | Denning | 317/234 |
| 3,332,137 | 7/1967 | Kenny | 29/423 |
| 3,385,729 | 5/1968 | Larchian | 117/200 |

OTHER PUBLICATIONS

Gates, I.B.M. Tech. Discl. Bull., Vol. 8, No. 11, April, 1966, Page 1687.

*Primary Examiner*—Martin H. Edlow
*Attorney*—Julius B. Kraft

[57] ABSTRACT

A semiconductor structure with a metallic oxide coated surface, a silicon nitride coating on the metal oxide and a covering coating of glass over the coated surface.

11 Claims, 5 Drawing Figures

COATED SEMICONDUCTOR STRUCTURES AND METHODS OF FORMING PROTECTIVE COVERINGS ON SUCH STRUCTURES

This is a continuation, of application Ser. No. 778,527 filed Nov. 25, 1968, now abandoned.

BACKGROUND OF THE INVENTION

1. Field of the Invention

The present invention relates to microelectronic semiconductor devices and circuits which are covered with coatings for the passivation, stabilization and physical protection of the underlying structure.

2. Description of the Prior Art

Microelectronic semiconductor devices and circuits, when used for many applications such as computers, must be made to an exacting specification to assure selected electrical characteristics and to provide for precise performance. The prior art has recognized that in order to retain these electrical characteristics, the surfaces of the devices must be protected against factors which would impair the required characteristics or otherwise damage the devices.

To this end, coatings of metallic oxides, including the oxide of the semiconductor substrate itself, have been utilized to protect the surface of the semiconductor substrate. However, such oxide coatings, particularly silicon oxide, were found to have tendencies towards ionic polarization, particularly in PN junction areas. Such polarization produces detrimental changes in the surface potential of the semiconductor substrate. In addition, charged ionic particles, such as potassium, sodium and hydrogen ions, were found to migrate readily through the silicon oxide, particularly when an electric potential gradient existed, to detrimentally affect the electrical properties of the underlying semiconductor substrate. In order to remedy such problems, silicon nitride has been proposed for use as an insulatng and passivating coating. It has been suggested that the silicon nitride coating may be used either directly on the semiconductor surface or on the silicon oxide coating. However, while silicon nitride coating has minimized ion migration and undesirable changes in the surface potential of the semiconductor substrate, it would appear that the silicon nitride does not insure the requisite protection and passivation for the semiconductor structures, particularly structures with extensive metallurgy.

Another approach which has been successfully used to passivate and protect semiconductor substrates is the composite of a phosphosilicate "glass" ($P_2O_5$–containing $SiO_2$) coating over the substrate surface covered with a top coating of glass. In such a structure, the metallic connections are disposed on the phosphosilicate "glass" coating. While this composite structure satisfactorily serves the passivation and protective needs of semiconductor structures in the present state of microelectronic development, a tendency has been noted which can cause potential problems in future semiconductor structures having devices of increasing density per unit area and smaller dimensions. This tendency manifests itself when contact holes are etched through the top layer of glass to an underlying metallic connector. If there are pin holes or other defects in the metallic connector which happen to coincide with the contact hole being etched through the top layer of glass, then the etchant will pass through the pin hole and attack the underlying coating of phosphosilicate glass and any silicon oxide layers under said coating because the etchant for glass also etches the other materials. The underlying layers may be thus etched down to the semiconductor substrate, resulting in short circuits when metal is subsequently deposited in the contact hole. Even if the underlying layers are not etched completely through to the substrate, the passivation and protection characteristics of the underlying phosphosilicate glass layer may be substantially impaired.

SUMMARY OF THE INVENTION

Accordingly, it is an object of the present invention to provide a coated semiconductor structure in which the substrate is protected against undesirable ion migration, as well as moisture and mechanical damage.

It is a further object of this invention to provide a protective coating for metal connectors for the semiconductor structure.

It is still another object of this invention to provide a novel composite coating for a semiconductor structure which insulates metallic connectors from the semiconductor substrate.

It is a further object of this invention to provide a composite coated semiconductor structure which is free of short circuits or other impairment resulting from pin holes in the metal connectors in the area of the contact metallurgy to said connectors.

The present invention accomplishes these and other objects by providing a semiconductor structure in which a semiconductor body which may contain one or more active or passive devices has at least one surface coated with a coating of metal oxide. A coating of silicon nitride is disposed on said oxide coating and these two coatings are under a covering coating of glass. In planar semiconductor substrates where metallic connectors to and from devices run above the surface of the substrate, such connectors should preferably be disposed intermediate the silicon nitride coating and the covering glass coating, most preferably directly on the silicon nitride coating. The structure of the present invention insures substantially complete passivation of the semiconductor substrate from the migration of ions, such as sodium or potassium, as well as complete protection of the substrate and the metallic connectors against the effects of the ambient, such as moisture damage. Also, the semiconductor substrate and metallic connectors are protected against any mechanical damage resulting from handling and processing of the structure.

In addition, the previously mentioned tendency towards short circuits and impaired passivation due to undesirable etching of coatings underlying the metal connectors is eliminated. The silicon nitride layer under the metal connectors is unaffected by etchants used in forming the contact holes in the covering glass layer. Thus, etchants which may randomly pass through pin holes in the metallic connectors will not impair the protective and passivation properties of the silicon nitride underlayer.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
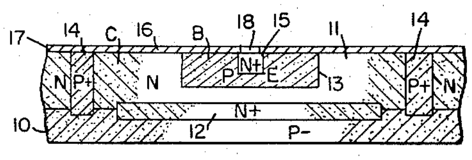
FIGS. 1–5 are sectional, diagrammatic views illustrating the steps in forming a coated structure in accordance with one embodiment of the present invention, starting with a portion of a semiconductor substrate in which an NPN transistor has already been formed.

With reference to FIG. 1, in order to illustrate the structure of the present invention, we start with a semiconductor substrate of conventional structure, a portion of which containing a transistor is shown in FIG. 1. The transistor may be formed in accordance with any known method; for example, co-pending application Ser. No. 640,610 describes a method for forming the transistor structure shown in FIG. 1. P- type conductivity silicon substrate 10, having a resistivity of 10–20 ohms-cm. and a thickness of about 10 mils, supports an epitaxial region 11 of N type conductivity having a resistivity of 0.09 ohms-cm. and a thickness of approximately 5 to 6 microns. Buried subcollector region 12 has a sheet resistance of approximately 9.0 ohms per square. P type base region 13 has a sheet resistance of about 150 ohms per square. Surrounding P+ type conductivity isolation regions 14 have a sheet resistance of approximately 2.5 ohms per square and N+ type conductivity emitter 15 has a sheet resistance of approximately 3.5 ohms per square. Surface 17 of the semiconductor substrate is covered by oxide coating 16.

FIG. 1 shows the oxide coating after emitter diffusion has been carried out through opening 18. While oxide coating 16 may be any of the metal oxide protective coatings conventionally used in semiconductor fabrication, for example aluminum oxide, it is preferably a silicon oxide film formed directly on surface 17. Any conventional technique may be employed for forming a silicon oxide coating, and its specific selection will be dictated by the nature of the semiconductor substrate. For example, in the case of germanium semiconductor material, the silicon oxide may be formed by pyrolytic growth. In such a process, the oxide is formed by the decomposition of a silicon compound having an Si-O bond such as a siloxane or an organic silicate. However, where a silicon semiconductor material is employed, the silicon oxide film is preferably a genetic layer formed by thermal growth from the parent silicon body. Such film may be derived from the parent silicon body by various means that are well known in the art, such as by electro-chemical treatment or by heating the body to between 900° C to 1400° C in an oxidizing atmosphere of air saturated with water vapor or an atmosphere of steam. U.S. Pat. No. 2,802,760 of Derick et al., granted Aug. 13, 1957 and entitled "Oxidation of Semiconductor Surfaces for Controlling Diffusion" describes one such treatment. Although the exact chemical composition of the oiide film 16 is not known, it is believed that silicon dioxide is the major component of that film. However, it is referred to in this application and in the claims as a silicon oxide film. Alternatively, the silicon oxide may also be deposited by RF sputtering.

The silicon oxide coating 16 has a preferable thickness in the range of from 2,000 A to 8,000 A. In the present embodiment, the thickness is about 6,000 A.

If emitter 15 has been formed by a conventional sealed tube or capsule type diffusion carried out in an evacuated tube containing either an arsenic or phosphorus doped silicon source, the semiconductor member will have substantially the exact structure shown in FIG. 1. On the other hand, if emitter 15 has been formed by the more widely used, conventional open tube phosphorus diffusion technique, a thin coating of phosphosilicate glass ($SiO_2$ containing $P_2O_5$) will be formed within opening 18 and in the surface region of $SiO_2$ layer 16. This thin, phosphosilicate glass layer has no effect on the structure of the present invention and need not be removed. Therefore, the terms "silicon oxide" or "silicon dioxide," as used in the present application, are intended to include phosphosilicate glass. However, in the structure of the preferred embodiment, the thin phosphosilicate glass which is formed during open tube phosphorus emitter diffusion is removed by dipping the structure in the conventional dilute acid etch. This removal is not necessary and is done primarily to illustrate the effectiveness of the subsequently applied combination of a silicon nitride coating and a glass covering coating.

Figure 2:
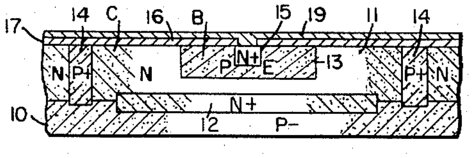

In the next fabrication step, as shown in FIG. 2, a thin, contiguous silicon nitride coating 19 is deposited on the silicon oxide coating 16. The silicon nitride film may be formed by known techniques such as RF sputtering, as described in co-pending application Ser. No. 494,789, filed Oct. 11, 1965, or by reactive sputtering, as described in co-pending application Ser. No. 583,175, filed Sept. 30, 1966. Both of these applications are assigned to the assignee of the present invention.

However, silicon nitride coating 19 is most preferably formed by pyrolytic deposition from the vapor phase. A gaseous mixture of silane and ammonia is heated to a temperature of about 900° C in the presence of the semiconductor substrate. At this temperature, the nitride is formed by thermodecomposition and deposits on the substrate.

While the exact thickness of the silicon nitride film 19 is not critical, for practical reasons its thickness should be below 2,000 A and preferably from 200 A to 1,000 A.

Figure 3:
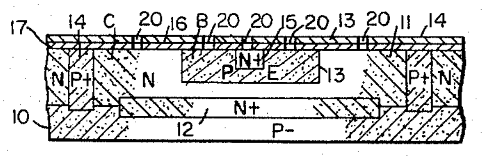

Openings 20, FIG. 3, through which metal connectors will contact surface 17, are formed by providing a photoresist pattern, corresponding to the openings, by conventional photolithography techniques. Then, utilizing an appropriate etchant, such as ammonium hypophosphate ($NH_4H_2PO_4$), which selectively etches the portions of silicon nitride layer 19 not covered by photo-resist, the silicon nitride layer is removed from openings 20. Because the ammonium hypophosphate is not an etchant for silicon dioxide layer 16, the silicon dioxide is removed from openings 20 by then immersing the entire structure in a conventional etchant such as a buffered solution of hydrofluoric acid and ammonium fluoride.

Figure 4:
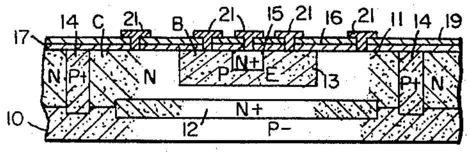

Next, as shown in FIG. 4, metallic connectors 21 and contacts 22 of these connectors to the semiconductor substrate are formed. The entire surface of the structure is coated with a layer of a suitable metal such as aluminum; this metal fills openings 20 to reach the substrate surface 17. Then, using a subtractive etch procedure involving conventional photo-resist techniques, the excess metal is removed, leaving connectors 21 and contacts 22.

While aluminum has been used in forming the metallurgy, other conventional metals such as platinum, palladium, molybdenum or composites, such as chromium-silver-chromium, or titanium-silver-chromium, may also be used.

Figure 5:
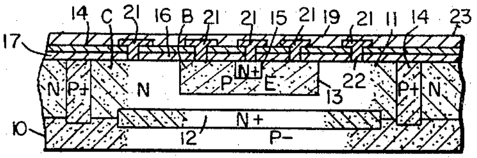

Next, as shown in FIG. 5, a covering layer of glass 23 is formed over the surface of the structure. The glass is preferably deposited by an RF sputtering technique utilizing apparatus such as that described in U.S. Pat. No. 3,369,991, P.D. Davidse et al. In addition to the preferred sputtering technique, the glass may be deposited by any conventional technique for forming a glass coating, such as spraying, settling, or silk screening, followed by a firing operation. Alternatively, the glass may be conveniently deposited by the method described in U.S. Pat. No. 3,212,921, W.A. Pliskin et al., which involves depositing a glass coating from a finely divided suspension of glass particles onto the substrate which is heated to a temperature above the softening temperature of the glass particles. The glass may also be deposited by pyrolytic methods.

The glass coating may have a thickness preferably in the range of from 2,000 A to 500,000 A, most preferably 20,000 A to 50,000 A, with best results being achieved by coatings having a thickness in the order of 30,000 A. The glass composition may be any conventional glass composition including those described in Volume 10, pp. 533–546, of the Encyclopedia of Chemical Technology, Kirk and Othmer, Second Edition, published in 1966 by Interscience Publishers. However, the silicate glasses, such as those described on pp. 540–545 in the above encyclopedia, have been found to be particularly desirable. The term "silicate glasses," as used in this application, is meant to include all silica-containing glasses including glasses which are substantially unmodified silica ($SiO_2$). In addition, among the silicate glasses which may be used are alkali silicate glasses which are modified by $Na_2O$, soda-lime glasses, borosilicate glasses, alumino-silicate glasses, and lead glasses.

In the preferred embodiment, the glass coating is contiguous to the underlying silicon nitride coating. This contiguous relationship is not required for the practice of the present invention. It is only necessary that the glass coating be disposed over or covering the silicon nitride coating. Other layers may be sandwiched between the silicon nitride coating and the covering glass coating.

One advantageous aspect of the present invention resides in the disposition of the metallic connectors intermediate the silicon nitride coating and the covering glass coating. This complete enclosure of the metallic connectors affords maximum protection from the corrosive effects of moisture. The silicon nitride coating protects the metallic connectors from any moisture which may be present in the underlying silicon oxide coatings. When the silicon oxide coatings have been formed by oxidation in an atmosphere saturated with water vapor or in a steam atmosphere, substantial amounts of moisture become trapped in the silicon oxide layer. This moisture will have a corrosive effect on any metallic connectors placed directly on the oxide. Likewise, the covering glass coating protects the metallic connectors from the effect of any moisture in the ambient.

While the silicon nitride coating is preferably formed on the silicon oxide coating, the silicon nitride coating may be formed directly on the semiconductor substrate.

Where required, suitable contact holes may be etched through the glass coating to underlying metallic connectors. In this connection, the covering glass coating need not necessarily be the external or outside coating of the structure. The present structure may be used in a multilayer glass and metallic contact arrangement wherein further coatings of glass or other insulative materials are disposed on the covering glass coating 23, and further metallic connectors are supported on these insulative coatings with appropriate interconnections between the metallurgy of the instant structure and that on higher levels being made through such contact holes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor structure comprising:
- a thin planar silicon wafer of a first conductivity type;
- at least one region of opposite conductivity type extending from one surface of said wafer;
- a coating of silicon oxide on said surface;
- a coating of silicon nitride over said silicon oxide coating;
- a coating of glass over said nitride coating; and,
- at least one metallic connector in ohmic contact with said region and having a portion thereof disposed on said silicon nitride coating intermediate the silicon nitride coating and the glass coating.

2. A semiconductor structure comprising:
- a semiconductor body;
- a coating of dielectric metal oxide on a portion of a surface of said body;
- a coating of silicon nitride over said oxide coating;
- a coating of glass over said nitride coating; and
- metallic connectors disposed on said nitride coating intermediate the silicon nitride coating and the glass.

3. The semiconductor structure of claim 2 wherein said semiconductor body is of one conductivity type and at least one region of opposite conductivity type extends from said surface.

4. The semiconductor structure of claim 2 further including metallic contacts extending through the glass coating to contact said metallic connectors.

5. The structure of claim 3 wherein said metal oxide is silicon oxide.

6. The structure of claim 3 wherein said body is silicon and said metal oxide is a genetic silicon oxide film of said body on said surface thereof.

7. The structure of claim 5 wherein said glass is a silica substantially unmodified.

8. In a method of fabricating semiconductor substrates, the steps comprising:
- forming a coating of a metal oxide on a portion of a surface of a semiconductor substrate;
- depositing a coating of silicon nitride over said oxide coating;
- forming at least one metallic connector disposed on said nitride coating; and,
- depositing a coating of glass over said metallic connector and nitride coating.

9. The method of claim 8 wherein an opening is formed by chemically etching through said silicon nitride and oxide coatings and said metallic connector is formed extending into said opening.

10. The method of claim 8 wherein said metal oxide coating is formed by thermally growing a genetic layer of silicon oxide.

11. The method of claim 8 wherein said substrate has a PN junction at the surface thereof and said metal oxide coating is formed overlying said junction.

* * * * *